United States Patent [19]
Greene

[11] Patent Number: 4,904,962
[45] Date of Patent: Feb. 27, 1990

[54] GATED HIGH STABILITY LC STABILIZED OSCILLATOR

[75] Inventor: David C. Greene, Knoxville, Tenn.

[73] Assignee: North American Philips Corporation, New York, N.Y.

[21] Appl. No.: 304,698

[22] Filed: Jan. 31, 1989

[51] Int. Cl.$^4$ ............................................. H03B 5/12
[52] U.S. Cl. ................................. 331/117 R; 331/173
[58] Field of Search ........ 331/108 R, 117 R, 117 FE, 331/167, 172, 173

[56] References Cited

U.S. PATENT DOCUMENTS 3,991,388 11/1976 Harshbarger .................. 331/117 R
4,533,881 8/1985 Monett ........................ 331/117 R X

FOREIGN PATENT DOCUMENTS 55-46612 4/1980 Japan .

Primary Examiner—Eugene R. LaRoche
Assistant Examiner—Robert J. Pascal
Attorney, Agent, or Firm—Edward W. Goodman

[57] ABSTRACT

A gated oscillator circuit for generating a sampling signal for digitally processing television signals, uses an LC oscillator to achieve, high frequency stability and reduced edge jitter. Circuitry is provided on both sides of a tank circuit in the oscillator for decoupling the tank circuit from other active circuit elements thereby enhancing the frequency stability.

9 Claims, 2 Drawing Sheets

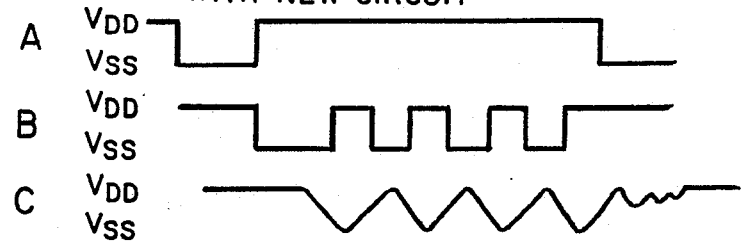
FIG. 5
DIAGRAM OF VOLTAGES ASSOCIATED WITH NEW CIRCUIT
FIG. 6
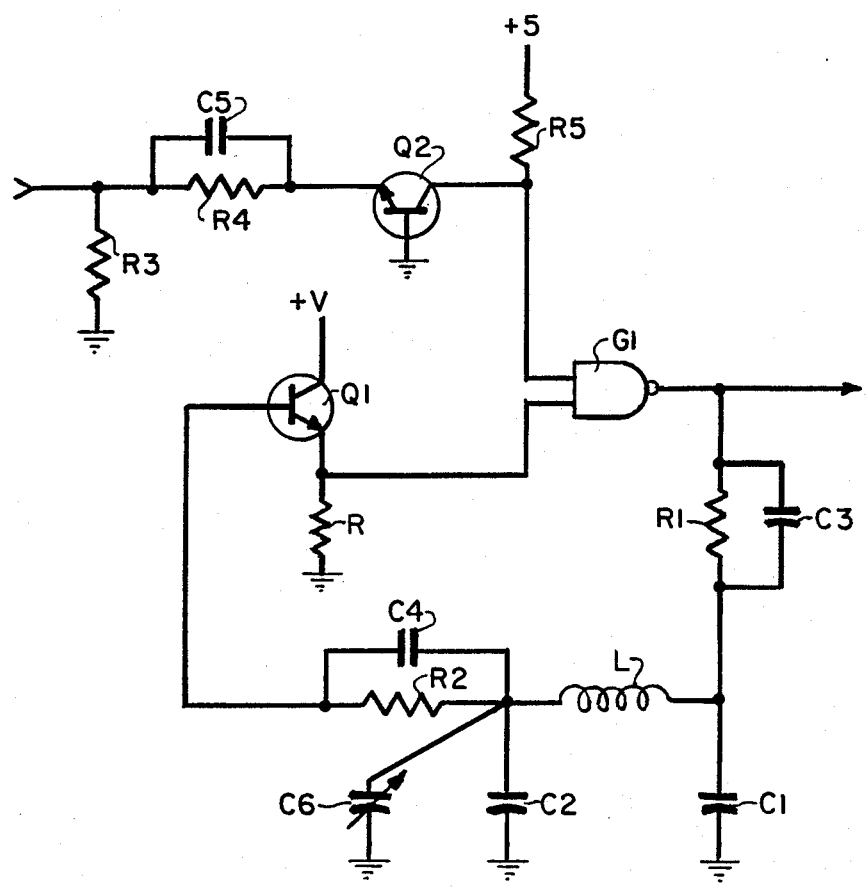

GATED HIGH STABILITY LC STABILIZED OSCILLATOR

BACKGROUND OF THE INVENTION

1. Field of the Invention

The subject invention is related to gated oscillators and, more particularly, to gated oscillator circuits for forming sampling clock signals for digital signal processing.

For example, in digital processing of a television signal, it is necessary to take a given number of samples for each horizontal scanning line. For example, the NTSC system defines a sampling frequency of 910 Fh, where Fh is the horizontal scanning frequency and is equal to 15,734.26573 Hz., giving a sampling frequency Fs of 14,318,181.82 Hz. and a sampling time $$Ts = 1/Fs = 69.841269 \text{ ns.}$$

If it is assumed that the active line time is 53.0095 us., then the number of active samples N is 759, that is, there are 759 samples of active video for each horizontal line. To do this, it is necessary to have a device which generates a sample command every 69.84 ns. after the horizontal blanking indicates the beginning of the active horizontal line time. In particular, what is needed is an oscillator which can be started and stopped by the horizontal blanking signal.

2. Description of Related Art

In prior art devices, the sampling clock has been provided using a gated RC relaxation oscillator. The circuit shown in FIG. 1 is one of many that has been used. Before power is applied, the gate input and output are at ground potential and capacitor C is discharged. When power is applied, the output goes high and capacitor C charges through resistor R until the level Vdd is reached (see FIG. 2). At this point, when the gate input goes high, the output goes low discharging the capacitor C causing the voltage thereacross to drop to the level Vn, whereupon the output goes high again charging the capacitor C raising the voltage to the level Vp. The voltage across the capacitor C and the output therefore alternately swing back and forth between Vn and Vp until the gate input goes low. Then the output goes high and further operation is halted. The capacitor C then is charged, through the resistor R, back to the level Vdd readying the oscillator for reuse.

The oscillator period is given by:
$T = T1 + T2$
$T1 = R(C)Ln((Vdd - Vn)/(Vdd + Vp))$
$T2 = R(C)Ln(Vp/Vn)$ Since R, Vp and Vn can vary with temperature and voltage changes, T1 and T2 can also vary. Thus the frequency is not very stable. Also, the exact switching point of the output with respect to Vp or Vn is modulated with the ever present circuit noise. This causes the edge of the output at switching to change slightly or jitter in a random fashion. The edge jitter or noise is characteristic of relaxation type oscillators.

SUMMARY OF THE PRESENT INVENTION

It is an object of the present invention to provide a gated oscillator circuit with improved frequency stability.

It is a further object of the present invention to provide an oscillator circuit exhibiting very low edge jitter.

The above objects are achieved in an oscillator circuit comprising an LC oscillator, means coupled to the oscillator for controlling loading on the oscillator, and means for starting and stopping oscillations of the oscillator.

In a practical embodiment of the subject invention, the oscillator circuit comprises a transistor having a base, an emitter and a collector, a bias potential being applied to the collector; an inductor; a pair of capacitors connected, respectively, between a first end and a second end of the inductor and ground; a first parallel arrangement of a resistor and a capacitor coupled between the emitter of the transistor and the first end of said inductor; a second parallel arrangement of a resistor and a capacitor coupled between the second end of said inductor and the base of the transistor; and a NAND-gate having a first input and an output connected respectively between the emitter of the transistor and the first parallel arrangement, a second input of the NAND-gate receiving a gate signal for starting and stopping the oscillations of the oscillator circuit.

BRIEF DESCRIPTION OF THE DRAWINGS

With the above and additional objects and advantages in mind as will hereinafter appear, the invention will be described with reference to the accompanying drawings, in which:

FIG. 5 shows waveforms appearing at various points in the oscillator circuit of FIG. 4; and FIG. 6 shows the oscillator circuit of FIG. 4 incorporated in a digital television processor.

DESCRIPTION OF THE PREFERRED EMBODIMENT

Figure 1:
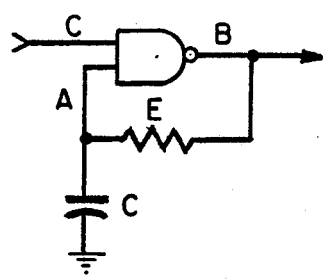
FIG. 1 shows a typical prior art oscillator circuit.
Figure 2:
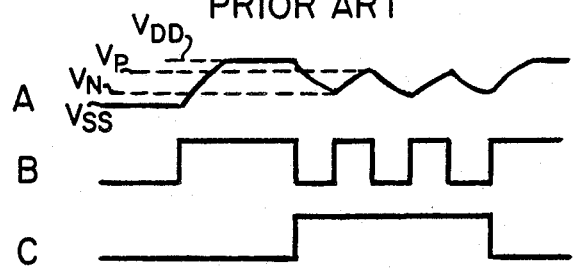
FIG. 2 shows waveforms appearing at various points in the oscillator circuit of FIG. 1.
Figure 3:
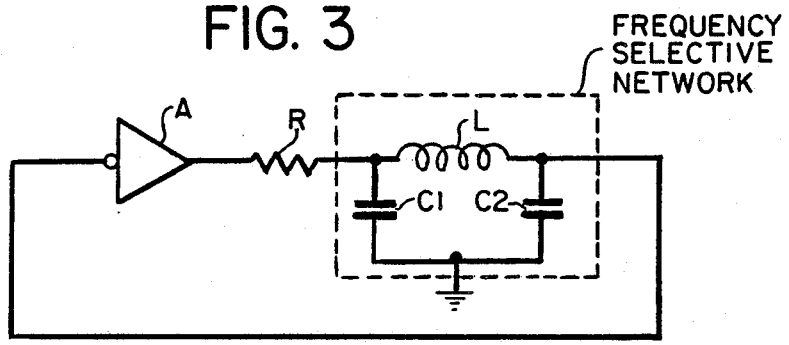
FIG. 3 shows a circuit diagram of a Colpitts oscillator.

The basic Colpitts oscillator is shown in FIG. 3. The oscillator includes an amplifier A having an inverting input, and the series arrangement of a resistor R and an inductor L connected between an output and the input of the amplifier A. A pair of capacitors C1 and C2 respectively connect the ends of the inductor L to ground. The circuit will oscillate if the total loop gain is greater than or equal to 1.0, that is, the power gain of the amplifier is sufficient to overcome losses in the frequency selective network (or tank circuit), L, C1 and C2. The frequency of this oscillation is $$Fo = 1/(2\pi \sqrt{L(Cr)}), \text{ where } Cr = C1C2/(C1 + C2)$$

where $Cr = C1C2/(C1 + C2)$ in which the input impedance of the amplifier A is infinity, the output impedance is zero and the phase angle of the forward transfer is 180 degrees.

Figure 4:
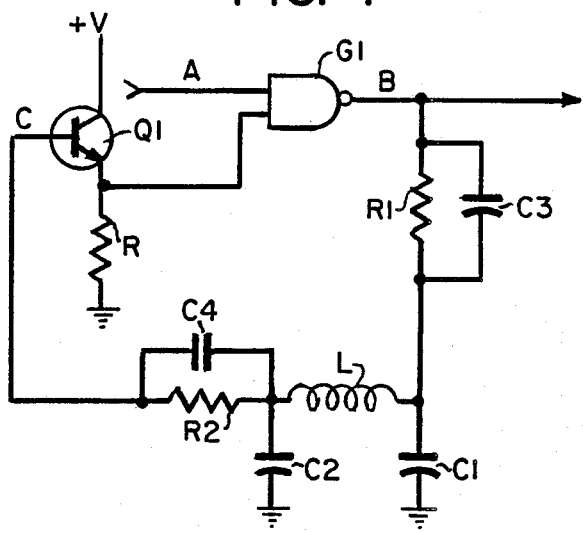
FIG. 4 shows a circuit diagram of an oscillator circuit of the subject invention.

FIG. 4 shows a circuit diagram of an oscillator circuit using the basic Colpitts oscillator shown in FIG. 3. Instead of amplifier A, npn transistor Q1 is provided and has its collector connected to a supply of power +V. An emitter of the transistor Q1 is connected to ground via resistor R and to an input of a NAND-gate G1. The output of NAND-gate G1 is connected to a parallel arrangement of a resistor R1 and a capacitor C3, which is in turn connected to the tank circuit of inductor L and capacitors C1 and C2. A second parallel arrangement of a resistor R2 and capacitor C4 then connects the tank circuit to the base of the transistor Q1. A gate signal may then be applied to the other input of the NAND-gate G1, the output of the oscillator circuit appearing on the output of the NAND-gate G1.

Referring to FIG. 5, the operation of the circuit will now be described. Upon initial application of power with the gate signal low, the output of NAND-gate G1 is high and capacitors C1 and C2 are charged through resistor R1 to the level Vdd. Upon application of the gate signal, the output of NAND-gate G1 goes low and capacitor C3 charges from capacitor C1. This causes a current to flow in the inductor L and consequently in the capacitors C1 and C2. The d.c. level on capacitors C1 and C2 decreases until the d.c. voltage at the input of NAND-gate G1 reaches the threshold voltage. Since inductor L and capacitors C1 and C2 form a resonant circuit, sinusoidal oscillations are set up in the tank circuit. In addition, since at the resonant frequency, there is a 180 degree phase shift from the input to the output of the tank circuit, this sinusoidal oscillation is buffered by transistor Q1 and is fed to the input of the NAND-gate G1 thereby switching the NAND-gate G1 on and off. The NAND-gate G1 operates in its linear region and provides all of the voltage gain of the circuit. The rate or frequency of this switching on and off of the NAND-gate G1 is determined by L, C1' and C2', where C1'=C1+C3 and C2'=C2+any stray circuit capacitance (e.g., capacitor C4 in series with transistor Q1's input capacitance).

Since resistors R1 and R2 form a d.c. path from the input to the output of NAND-gate G1, the d.c. component of the signal at the input of NAND-gate G1 is biased automatically to the center of the threshold region. This insures self starting of the circuit due to self biassing as a result of this negative d.c. feedback loop. By selecting low values for capacitors C3 and C4, the tank circuit is effectively decoupled from the NAND-gate G1 resulting in improved frequency stability. The higher overall operating Q also improves frequency stability and lowers edge jitter. Since NAND-gate G1 at the transition point acts like a linear amplifier with high gain, the noise performance is improved again leading to lower edge jitter.

FIG. 6 shows a circuit diagram of the oscillator circuit of FIG. 4 having an input gate circuit to which is applied the composite blanking signal of a television signal. This input gate circuit includes a resistor R3 connected to ground across which the blanking signal is applied. The parallel arrangement of a resistor R4 and a capacitor C5 applies the blanking signal to the emitter of a grounded base npn transistor Q2 whose emitter is connected, on the one hand, to a +5 volt supply via resistor R5 and, on the other hand, to the input of NAND-gate G1. To allow for minor adjustments, a variable capacitor C6 is inserted in the oscillator circuit and is connected between the output of the tank circuit and ground.

In a practical embodiment of the circuit of FIG. 6, the individual components had the following values:

| | |
|---|---|
| C1 - 39 pf. | R - 820 ohms |
| C2 - 39 pf. | R1 - 2K ohms |
| C3 - 15 pf. | R2 - 10K ohms |
| C4 - 4.7 pf. | R3 - 75 ohms |
| C5 - 150 pf. | R4 - 560 ohms |
| C6 - 2-40 pf. | R5 - 1K ohms |

Numerous alterations of the structure herein disclosed will suggest themselves to those skilled in the art. However, it is to be understood that the described embodiment is for purposes of illustration only and is not to be construed as a limitation of the invention. All such modifications which do not depart from the spirit of the invention are intended to be included within the scope of the appended claims.

What is claimed is:

1. A gated LC stabilized oscillator circuit having high stability for generating a sampling clock signal for digital signal processing, including:
    an LC oscillator;
    means for controlling loading on said LC oscillator; and
    gate means for starting and stopping oscillations of said LC oscillator, wherein said LC oscillator is a Colpitts oscillator comprising a buffer amplifier and an LC tank circuit coupled between an input and an output of said buffer amplifier, said output of said buffer amplifier forming an output of said oscillator, and wherein said means for controlling the loading on said oscillator comprises a first parallel arrangement of a resistor and a capacitor coupled between said output of said buffer amplifier and said tank circuit.

2. An oscillator circuit as claimed in claim 1, wherein said means for controlling the loading on said oscillator further comprises a second parallel arrangement of a resistor and a capacitor coupled between said tank circuit and said input of said buffer amplifier.

3. An oscillator circuit as claimed in claim 2, wherein said gate means comprises a NAND-gate having a first input and an output coupled, respectively, between said output of said oscillator and said first parallel arrangement, a second input of said NAND-gate receiving a gate signal.

4. An oscillator circuit as claimed in claim 3, wherein said gate signal comprises a blanking signal in a composite video signal.

5. An oscillator circuit as claimed in claim 2, wherein said LC tank circuit comprises an inductor connected between an input and an output of the tank circuit, and a first and a second capacitor connected, respectively, between opposite ends of said inductor and ground.

6. An oscillator circuit as claimed in claim 2, wherein said buffer amplifier comprises a transistor having a base forming the input of the buffer amplifier, an emitter forming the output of the buffer amplifier, and a collector for receiving a bias voltage.

7. A gated stabilized oscillator circuit having high stability for generating a sampling clock signal for a digital television signal processor, comprising:
    a transistor having a base, an emitter and a collector, a bias potential being applied to said collector;
    an inductor;
    a pair of capacitors connected, respectively, between a first and a second end of said inductor and ground;
    a first parallel arrangement of a resistor and a capacitor coupled between said emitter of said transistor and the first end of said inductor;

a second parallel arrangement of a resistor and a capacitor coupled between the second end of said inductor and said base of said transistor; and a NAND-gate having a first input and an output connected respectively between said emitter of said transistor and said first parallel arrangement, a second input of said NAND-gate receiving a gate signal for starting and stopping oscillations of said oscillator circuit.

8. A gated stabilized oscillator circuit as claimed in claim 7, further comprising an input gate circuit coupled to said second input of said NAND-gate for receiving a blanking signal in a composite television signal and generating said gate signal in response to said blanking signal.

9. A gated stabilized oscillator circuit as claimed in claim 8, wherein said input gate circuit comprises an input resistor across which said blanking signal is applied; a parallel arrangement of a resistor and a capacitor for receiving the blanking signal applied to said input resistor;

and a transistor having a grounded base, an emitter coupled to said parallel arrangement, and a collector coupled both to said second input of said NAND-gate and to a supply of power via a resistor.

* * * * *